United States Patent
Munetoh et al.

(10) Patent No.: US 9,552,291 B2
(45) Date of Patent: Jan. 24, 2017

(54) MEMORY MANAGEMENT METHOD

(71) Applicant: International Business Machines Corporation, Armonk, NY (US)

(72) Inventors: Seiji Munetoh, Tokyo (JP); Nobuyuki Ohba, Sendai (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/722,532

(22) Filed: May 27, 2015

(65) Prior Publication Data

US 2015/0363311 A1 Dec. 17, 2015

(30) Foreign Application Priority Data

Jun. 17, 2014 (JP) ................................. 2014-124370

(51) Int. Cl.
G06F 12/06 (2006.01)
G06F 12/02 (2006.01)
G11C 14/00 (2006.01)

(52) U.S. Cl.
CPC ....... G06F 12/0638 (2013.01); G06F 12/0246 (2013.01); G06F 2212/205 (2013.01); G06F 2212/7201 (2013.01); G11C 14/0009 (2013.01)

(58) Field of Classification Search
CPC .............. G06F 12/0246; G06F 12/0253; G06F 12/0638; G06F 2212/205; G06F 2212/7201; G11C 7/1072

(Continued)

(56) References Cited

U.S. PATENT DOCUMENTS

2008/0109592 A1* 5/2008 Karamcheti .......... G06F 9/5016
711/103
2009/0172439 A1* 7/2009 Cooper ................. G06F 1/3203
713/323

(Continued)

FOREIGN PATENT DOCUMENTS

JP 2004362426 A 12/2004
JP 2005010897 A 1/2005

(Continued)

OTHER PUBLICATIONS

Translation of Japan Application No. 2014-124370, filed Jun. 17, 2014, entitled: "Memory Management Method", (20 pages).

(Continued)

Primary Examiner — Gary Portka
(74) Attorney, Agent, or Firm — Stosch Sabo

(57) ABSTRACT

A method for managing main memory including DRAM and NVRAM in a computer depending on the operation state of the computer is provided. The method includes: (a) upon start of the computer, loading a program and the like into the DRAM, and loading predetermined read-only data and the like into the NVRAM; (b) in a state transition from a normal operation to a suspend state, moving data in the DRAM to the NVRAM; (c) in a state transition from the suspend state to the normal operation, reading data from the NVRAM for program execution; (d) in the case where a data write to the NVRAM occurs, stopping the data write, and moving data in a data area of the NVRAM subjected to the data write, to the DRAM; and (e) performing the data write to the DRAM to which the data has been moved.

12 Claims, 5 Drawing Sheets

(58) Field of Classification Search
USPC .......................................... 711/101, 103, 105
See application file for complete search history.

(56) References Cited

U.S. PATENT DOCUMENTS

| | | | | |
|---|---|---|---|---|
| 2013/0077382 A1* | 3/2013 | Cho | ................... | G11C 5/04 |
| | | | | 365/148 |
| 2013/0283079 A1* | 10/2013 | Puthiyedath | .......... | G06F 1/3234 |
| | | | | 713/323 |
| 2013/0290759 A1* | 10/2013 | Kumar | ................ | G06F 1/3275 |
| | | | | 713/323 |

FOREIGN PATENT DOCUMENTS

| | | | |
|---|---|---|---|
| JP | 2009093502 A | 4/2009 |
| JP | 2010282252 A | 12/2010 |
| JP | 2014232525 A | 12/2014 |
| WO | 2006028658 A1 | 3/2006 |

OTHER PUBLICATIONS

Yoon et al., "Row Buffer Locality Aware Caching Policies for Hybrid Memories", Carnegie Mellon University, (pp. 1-8).
Wu et al., "eNVy: A Non-Volatile, Main Memory Storage System", 1993 IEEE, pp. 116-118.
Mogul et al., "Operating System Support for NVM+DRAM Hybrid Main Memory", HP Labs, Palo Alto, CA and Barcelona, Spain, pp. 1-5.

* cited by examiner

MEMORY MANAGEMENT METHOD

BACKGROUND

Technical Field

The present invention relates to a memory management method, and particularly relates to a method for managing main memory including DRAM and NVRAM in a computer depending on the operation state of the computer.

Background Art

Nonvolatile memory (hereafter referred to as "NVRAM") is currently in active research and development. The use of NVRAM is expected to achieve a memory system with higher integration, lower power, and lower cost in the future. This gives rise to the proposal to use DRAM and NVRAM in main storage memory in a computer.

However, NVRAM has drawbacks such as longer write times, higher write power consumption, a larger unit of writing, and lower write endurance than DRAM. These drawbacks need to be compensated for in order to use NVRAM as main storage memory, but sufficient improvements for actual use have not been made.

Under the circumstances, NVRAM is at best merely utilized for a data backup of main storage memory in actual use.

SUMMARY OF INVENTION

The present invention thus has an object of enabling the use of NVRAM as main storage memory in a computer, and particularly an object of providing a method for managing main memory including DRAM and NVRAM in a computer depending on the operation state of the computer.

One aspect of the present invention provides a method for managing main memory including DRAM and NVRAM in a computer depending on the operation state of the computer. The method includes: a step (a) of, upon start of the computer, loading at least one of a program and data into the DRAM, and loading at least one of a predetermined program and read-only data into the NVRAM; a step (b) of, in a state transition from a normal operation to a suspend state of the computer, moving data in the DRAM to the NVRAM on a page basis; a step (c) of, in a state transition from the suspend state to the normal operation of the computer, reading data from the NVRAM on a page basis for program execution by the computer; a step (d) of, in the case where a data write to the NVRAM on a page basis occurs in the step (c) of reading data from the NVRAM on a page basis, stopping the data write, and moving data in a data area of the NVRAM subjected to the data write, to the DRAM on a page basis; and a step (e) of performing the data write on a page basis to the DRAM to which the data has been moved.

One aspect of the present invention provides a computer program product for managing main memory including DRAM and NVRAM in a computer depending on the operation state of the computer. The computer program product includes at least one computer readable non-transitory storage medium having computer readable program instructions thereon for execution by a processor, and the computer readable program instructions include program instructions for: upon start of the computer, loading at least one of a program and data into the DRAM, and loading at least one of a predetermined program and read-only data into the NVRAM; in a state transition from a normal operation to a suspend state of the computer, moving data in the DRAM to the NVRAM on a page basis; in a state transition from the suspend state to the normal operation of the computer, reading data from the NVRAM on a page basis for program execution by the computer; in the case where a data write to the NVRAM on a page basis occurs in the reading data from the NVRAM on a page basis, stopping the data write, and moving data in a data area of the NVRAM subjected to the data write, to the DRAM on a page basis; and performing the data write on a page basis to the DRAM to which the data has been moved.

One aspect of the present invention provides a computer system for managing main memory including DRAM and NVRAM in a computer depending on the operation state of the computer. The computer system includes at least one processor; at least one computer readable memory; at least one computer readable tangible, non-transitory storage medium; and program instructions stored on the at least one computer readable tangible, non-transitory storage medium for execution by the at least one processor via the at least one computer readable memory, and the at least one computer readable memory includes the main memory including DRAM and NVRAM, and the program instructions include program instructions for: upon start of the computer, loading at least one of a program and data into the DRAM, and loading at least one of a predetermined program and read-only data into the NVRAM; in a state transition from a normal operation to a suspend state of the computer, moving data in the DRAM to the NVRAM on a page basis; in a state transition from the suspend state to the normal operation of the computer, reading data from the NVRAM on a page basis for program execution by the computer; in the case where a data write to the NVRAM on a page basis occurs in the reading data from the NVRAM on a page basis, stopping the data write, and moving data in a data area of the NVRAM subjected to the data write, to the DRAM on a page basis; and performing the data write on a page basis to the DRAM to which the data has been moved.

DESCRIPTION OF EMBODIMENT

Figure 1:
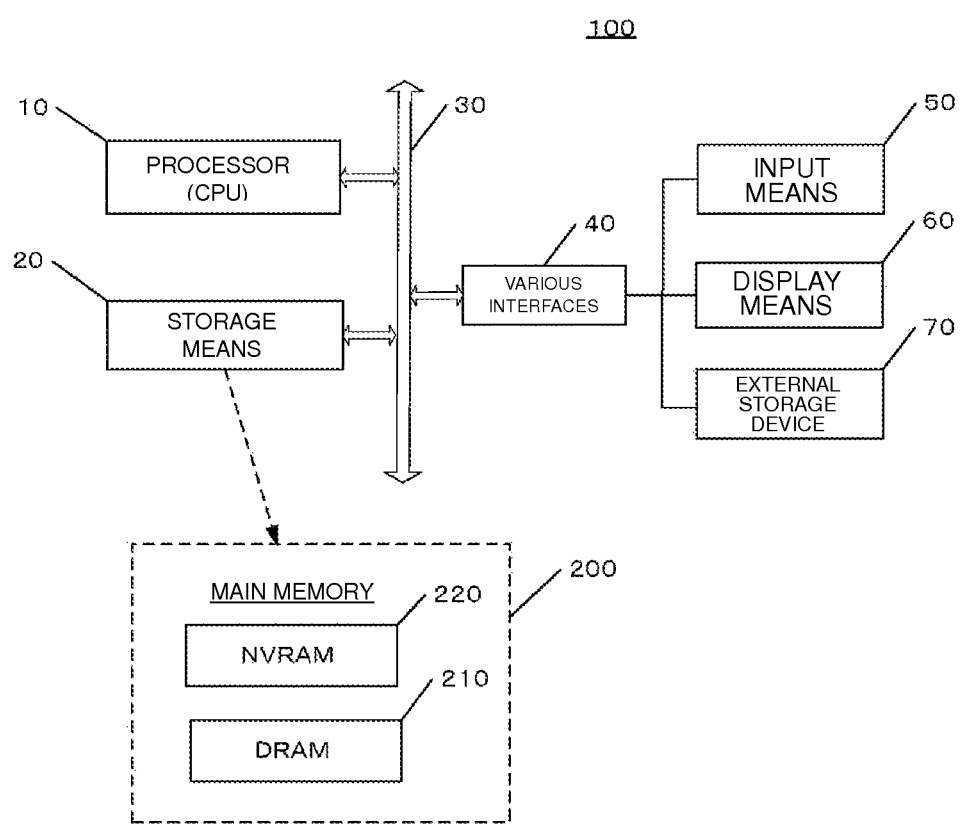
FIG. 1 is a block diagram showing a structural example of a computer for implementing the present invention.

The following describes an embodiment of the present invention with reference to drawings. FIG. 1 is a block diagram showing a structural example of a computer for implementing a method according to the present invention. A computer 100 includes a processor (hereafter referred to as "CPU") 10, storage means 20, and various interfaces (hereafter referred to as "I/Fs") 40, which are connected to each other via a bus 30. The various I/Fs 40 are a collective term for I/Fs including an input I/F, an output I/F, an external storage I/F, and an external communication I/F. Each I/F is connected to a corresponding one of input means 50 such as a keyboard and a mouse, display means 60 such as a CRT and an LCD, and external storage means 70 such as USB-connected semiconductor memory and an HDD.

The storage means 20 can include an HDD, semiconductor memory such as RAM or ROM, and the like. In the present invention, the storage means 20 includes DRAM 210 and NVRAM 220 that function as main memory 200. The NVRAM 220 can include any nonvolatile memory, such as EEPROM or flash memory, which is basically capable of storing data without continuous power supply. The method according to the present invention is implemented by the computer 100 executing predetermined software (including OS) stored in the storage means 20 or 70 or the like, as an example.

Figure 2:
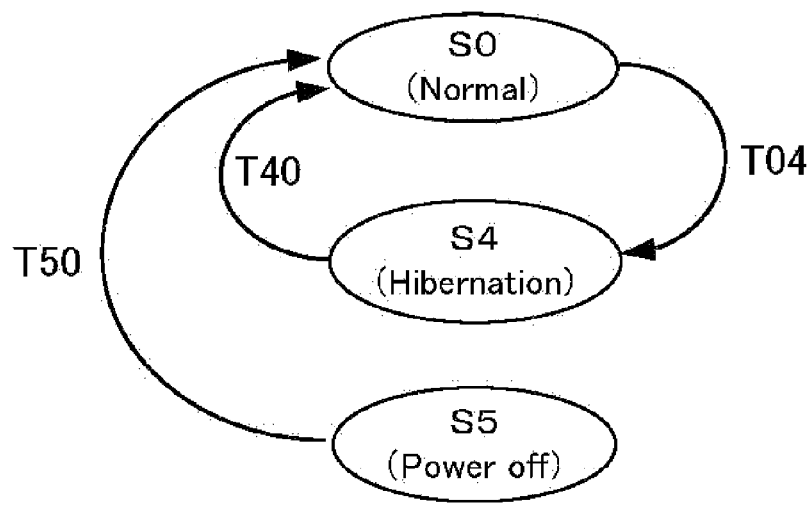
FIG. 2 is a diagram showing the transition of the operation state of ACPI to which the present invention is applicable.

FIG. 2 is a diagram showing the transition of the operation state of ACPI to which the present invention is applicable. ACPI stands for Advanced Configuration and Power Interface, which is an open unified standard for power control and configuration of PC/AT compatibles and the like. The application of the present invention is not limited to ACPI, and the present invention may be implemented based on any other standard or the like having the form (specification) equally involving the transition of the operation state of the computer.

ACPI defines six states S0 to S5 as the operation state of the computer. Of these states, the present invention particularly focuses on the three states S0, S4, and S5. The three states S0, S4, and S5 have the following meanings.
- S0: normal operation state
- S4: a state called suspend to disk or hibernation where the contents of memory are lost, which is the same as writing the contents of memory to an HDD or the like and powering off
- S5: complete power off In the present invention, the management of the main memory corresponding to the following three state transitions between the above-mentioned three states is executed as described later.
- T50: S5→S0
- T04: S0→S4
- T40: S4→S0

The following describes an embodiment of the present invention in each state transition of the computer, with reference to FIGS. 3 to 6.

State Transition T50

Figure 3:
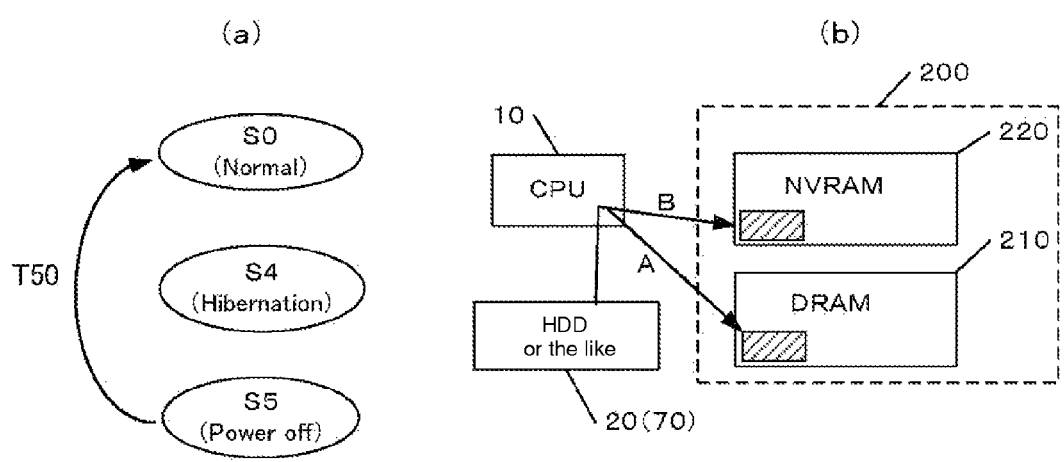
FIG. 3 is an image diagram of the operation state in an example of the present invention.

The state transition T50 is a state transition from power off (S5) to normal operation (S0) of the computer upon start (cold start), as shown in (a) in FIG. 3. The condition of moving and storing data and the like between the elements is shown in (b) in FIG. 3. Upon cold start, a BIOS boot loader calls an OS boot loader. The OS boot loader loads programs and data from the HDD, etc. 20 (70) into the DRAM 210, as indicated by arrow A. The OS boot loader also loads programs and data known to be read-only into the NVRAM 220, as indicated by arrow B. Moreover, an input/output buffer for a network device or an external storage is mapped onto the DRAM 210 because it is frequently written.

State Transition T04

Figure 4:
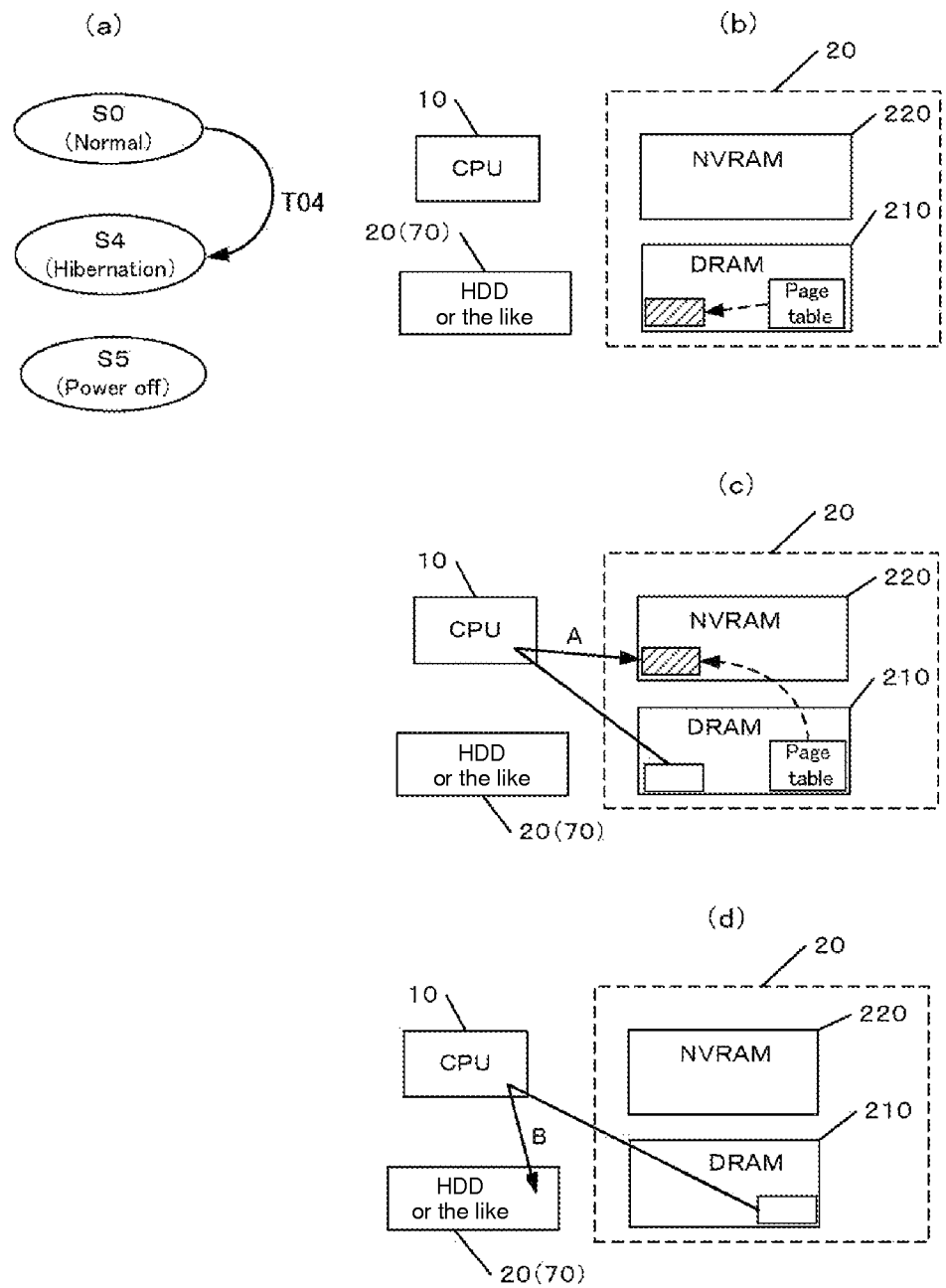
FIG. 4 is an image diagram of the operation state in an example of the present invention.

The state transition T04 is a state transition from normal operation (S0) to hibernation (S4) of the computer, as shown in (a) in FIG. 4. The condition of moving and storing data and the like between the elements is shown in (b), (c), and (d) in FIG. 4. As shown in (b) in FIG. 4, in the S0 state, data and the like and a page table are stored in the DRAM 210. As shown in (c) in FIG. 4, in the state transition T04, data in the DRAM 210 is moved to the NVRAM 220 on a page basis (hereafter "page" is also used with the same meaning as "data") (arrow A). The page table is updated to store in the NVRAM 220. The dotted arrow from the page table in each of (b) and (c) in FIG. 4 represents a pointer for specifying an area (address) in the memory. The same applies to FIGS. 5 and 6 described later. As shown in (d) in FIG. 4, in the case where all data cannot be moved to the NVRAM 220, data is moved to the HDD, etc. 20 (70) (arrow B). The page table is moved to the NVRAM 220 last.

State Transition T40

Figure 5:
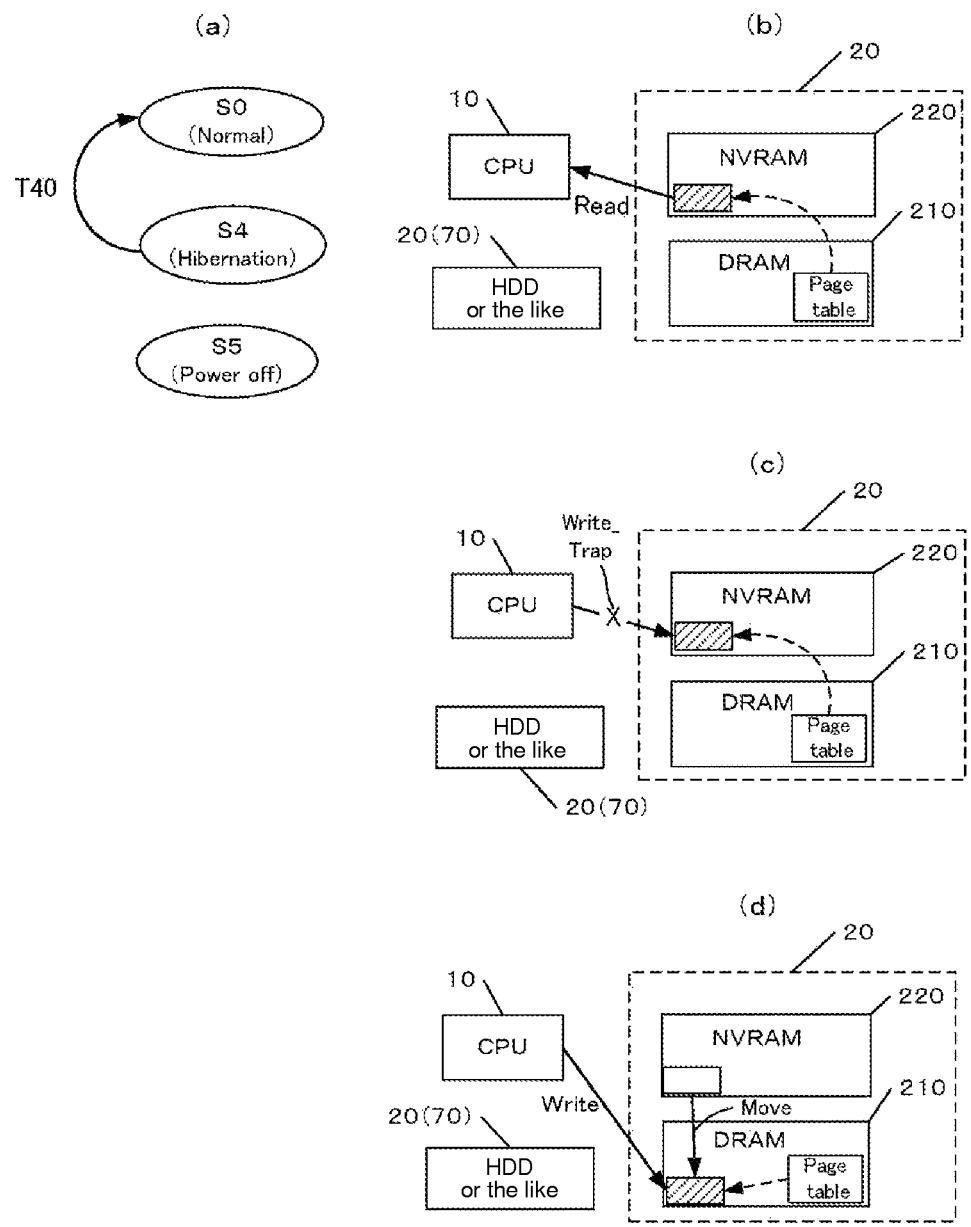
FIG. 5 is an image diagram of the operation state in an example of the present invention.

The state transition T40 is a state transition from hibernation (S4) to normal operation (S0) of the computer, as shown in (a) in FIG. 5. The condition of moving and storing data and the like between the elements is shown in (b), (c), and (d) in FIG. 5. In the state transition T40, the CPU 10 executes a program while reading data directly from the NVRAM 220. First, the page table is moved to the DRAM 210. As shown in (b) in FIG. 5, each page mapped on the NVRAM 220 is assigned a read-only attribute. As shown in (c) in FIG. 5, in the case where the CPU 10 makes a write request to the page, an exception is generated, that is, a page write fault is generated, to reject the write request once. As shown in (d) in FIG. 5, the data of the page is moved from the NVRAM 220 to the DRAM 210. After this, data is written to the DRAM 210. The page table is updated last.

The operations in (b) to (d) in FIG. 5 described above are similar to the method used in the conventional copy on write, but the present invention differs in that data is not copied but moved. Though the data in the NVRAM 220 need not be cleared, it is desirable to clear the data from a security perspective. In the case where the NVRAM 220 is flash memory, one block can be erased at once, and this erase function may be used. If the DRAM 210 has no free space, data in the DRAM 210 is moved to the NVRAM 220. If the NVRAM 220 has no free space, data is swapped out to the external storage device 70 like the typical paging operation.

Auxiliary Operation (Option) in State Transition T04

An option of moving a page in the DRAM 210 to the NVRAM 220 may be provided in order to reduce the amount of data moved in the state transition T04 described with reference to FIG. 4 and to reduce the usage of the DRAM 210 to free up space. This is described below, with reference to FIG. 6.

Figure 6:
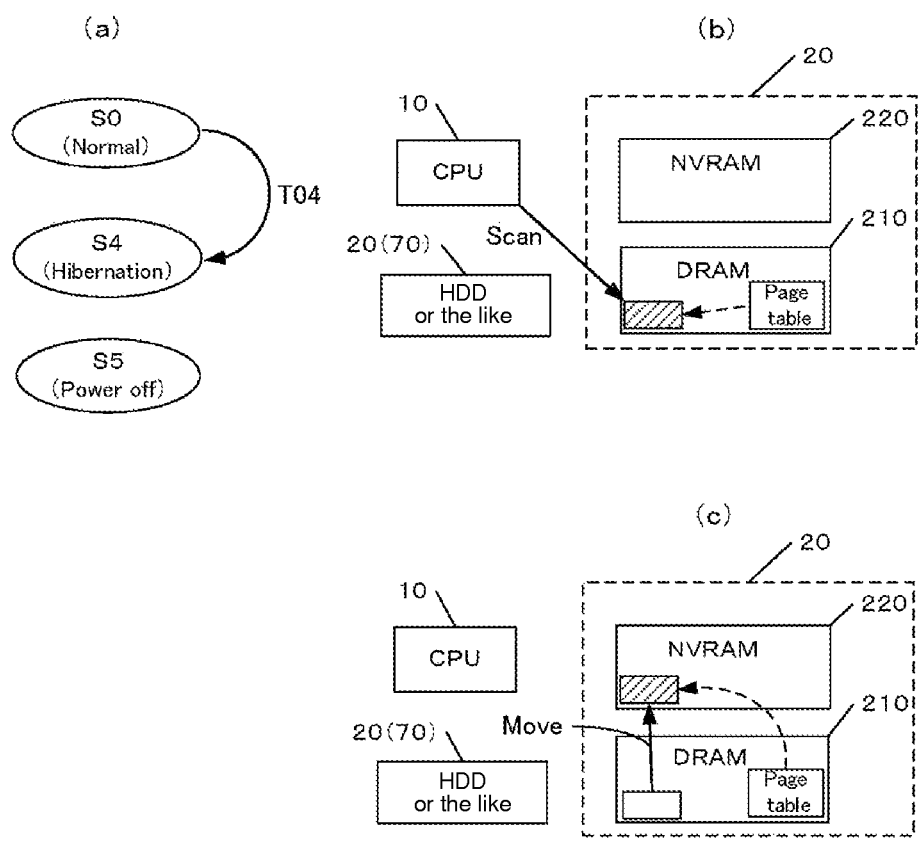
FIG. 6 is an image diagram of the operation state in an example of the present invention.

The use state of the page table in the DRAM 210 is scanned (arrow Scan), as shown in (b) in FIG. 6. In the case where any of the following conditions is met, a page in the DRAM 210 is moved to the NVRAM 220 (arrow Move), as shown in (c) in FIG. 6. Whether to use condition 1 or condition 2 may be determined appropriately.

Condition 1: move a page in the DRAM 210 that has not been used for the past Tu seconds, to the NVRAM 220

Condition 2: move a page in the DRAM 210 that has not been written for the past Tw seconds, to the NVRAM 220

As the trigger to start the scan in (b) in FIG. 6, for example, the auxiliary operation can be called from a program, such as the kscand or kswapd routine, running periodically in Linux®. Other examples of the trigger to start the scan include: when the operating ratio of the CPU 10 is less than or equal to a predetermined value; and when no user input has been made for a predetermined time (e.g. screen saver start timing).

According to one aspect of the present invention, in the computer in which the main memory includes DRAM and NVRAM, the NVRAM is used as a part of the main memory (as a complement/reinforcement to the DRAM) or as a data backup destination depending on the operation state of the computer. This allows the computer to operate faster or with less power using the main memory.

In one aspect of the present invention, the method further includes: a step of detecting a use state of the DRAM; and a step of moving a page in the DRAM that has not been read for a time T1 or has not been written for a time T2, to the NVRAM.

According to one aspect of the present invention, data is moved to the NVRAM beforehand depending on the use state of the DRAM. This increases the free space in the DRAM, and reduces the amount of data moved when the computer operation is suspended.

In one aspect of the present invention, the step of detecting a use state of the DRAM is performed: (i) at predetermined time intervals; (ii) in the case where an operating ratio of a processor in the computer is less than or equal to a predetermined value; or (iii) in the case where no input to the computer has been made for a predetermined time.

According to one aspect of the present invention, data is saved into the NVRAM beforehand depending on the operating condition of the computer (CPU). This increases the free space in the DRAM, and reduces the amount of data moved when the computer operation is suspended.

In one aspect of the present invention, the step (b) of moving data in the DRAM to the NVRAM on a page basis includes a step of moving data in the DRAM to an external storage device.

According to one aspect of the present invention, the external storage device complements a lack of space of the NVRAM. As a result, data can be moved smoothly and securely when the computer operation is suspended.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Though the embodiment of the present invention has been described with reference to drawings, the present invention is not limited to such an embodiment. Various improvements, modifications, and changes may be made based on the knowledge of those skilled in the art without departing from the scope of the present invention.

What is claimed is:

1. A method for managing main memory comprising DRAM and NVRAM in a computer depending on a transition of an operation state of the computer, the method comprising:
    upon start of the computer, loading at least one of a first program and a first data into the DRAM, and loading at least one of a second program and a second data into the NVRAM;
    in a state transition from a normal operation of the computer to a suspend state of the computer, moving the first data in the DRAM to the NVRAM on a page basis;
    in a state transition from the suspend state of the computer to the normal operation of the computer, reading the first data from the NVRAM on a page basis for program execution by the computer;
    in the case where a first data write to the NVRAM on a page basis occurs while reading the first data from the NVRAM on a page basis, stopping the first data write, and moving the first data in a data area of the NVRAM subjected to the first data write, to the DRAM on a page basis;
    performing the first data write on a page basis to the DRAM to which the first data has been moved;
    detecting a use state of respective instances of a page table stored in the DRAM;
    determining, based on detecting the use state of respective instances of the page table stored in the DRAM, that a third data in the DRAM has not been read for a second time interval;
    determining that the second time interval is greater than a threshold read time; and
    moving the third data from the DRAM to the NVRAM responsive to determining that the second time interval is greater than the threshold read time.

2. The method according to claim 1, wherein moving the first data in the DRAM to the NVRAM on a page basis includes moving the first data in the DRAM to an external storage device.

3. The method according to claim 2, wherein moving the first data in the DRAM to the NVRAM on a page basis includes updating a corresponding page table each time data is moved.

4. The method according to claim 1, wherein moving the first data in the DRAM to the NVRAM on a page basis includes updating a corresponding page table each time data is moved.

5. The method according to claim 1, wherein performing the first data write on a page basis to the DRAM to which the data has been moved includes updating a corresponding page table each time data is written.

6. The method according to claim 1, wherein the operation state of the computer is an operation state conforming to the Advanced Configuration and Power Interface (ACPI) standard.

7. The method according to claim 1, wherein detecting the use state of respective instances of the page table stored in the DRAM occurs at each first time interval.

8. The method according to claim 1, wherein detecting the use state of respective instances of the page table stored in the DRAM occurs responsive to detecting that no input has been made to the computer for a first time interval.

9. The method according to claim 1, wherein detecting the use state of respective instances of the page table stored in the DRAM occurs responsive to detecting that an operating ratio of a processor in the computer is less than or equal to a predetermined value.

10. The method according to claim 1, wherein in the case where the first data write to the NVRAM on a page basis occurs while reading the first data from the NVRAM on a page basis, stopping the first data write, and moving the first data in a data area of the NVRAM subjected to the first data write to the DRAM on a page basis further comprises:
    generating a first page write default to reject the first data write a first time; and
    moving the first data in a data area of the NVRAM subjected to the first data write to the DRAM on a page basis responsive to generating the first page write default and receiving the first data write a second time.

11. The method according to claim 1, further comprising:
    deleting the first data from the NVRAM in response to moving the first data from the NVRAM to the DRAM on a page basis.

12. The method according to claim 1, wherein moving the first data in the DRAM to the NVRAM on a page basis in the state transition from the normal operation of the computer to the suspend state of the computer further comprises:
    determining that the NVRAM has insufficient space to store the first data;
    transferring a first portion of data in the NVRAM larger than the first data from the NVRAM to an external storage device; and transferring the first data from the DRAM to the NVRAM in response to transferring the first portion of data from the NVRAM to the external storage device.

* * * * *